(12) United States Patent
Chiang

(10) Patent No.: US 6,903,923 B2
(45) Date of Patent: Jun. 7, 2005

(54) ROTARY LIFTING CAP

(75) Inventor: Thomas Chiang, Taipei (TW)

(73) Assignee: Delta Electronics, Inc., Taoyuan Hsien (TW)

(*) Notice: Subject to any disclaimer, the term of this patent is extended or adjusted under 35 U.S.C. 154(b) by 106 days.

(21) Appl. No.: 10/435,452

(22) Filed: May 12, 2003

(65) Prior Publication Data

US 2004/0120102 A1 Jun. 24, 2004

(30) Foreign Application Priority Data

Dec. 24, 2002 (TW) .................................... 91221025 U

(51) Int. Cl.[7] .............................................. H05K 5/00
(52) U.S. Cl. ..................... 361/679; 361/724; 312/223.1
(58) Field of Search ............................... 361/679, 724, 361/726; 312/223.1

(56) References Cited

U.S. PATENT DOCUMENTS

| | | | | |
|---|---|---|---|---|
| 5,825,614 A | * | 10/1998 | Kim | 361/683 |
| 6,128,186 A | * | 10/2000 | Feierbach | 361/683 |
| 6,130,822 A | * | 10/2000 | Della Fiora et al. | 361/724 |

* cited by examiner

*Primary Examiner*—Yean-Hsi Chang
(74) *Attorney, Agent, or Firm*—Birch, Stewart, Kolasch & Birch, LLP

(57) ABSTRACT

A rotary lifting cap for coupling on an electronic device adopts a design of two-stage extension arms and connection arms. A stub shaft is located at a lower and rear position of the lid at a selected distance to allow the lid to be turned and opened at a desired distance to avoid damage that might otherwise occur during operation. The invention further has an anchor section and sloped surfaces on the electronic device to facilitate positioning and anchoring of the lid.

7 Claims, 5 Drawing Sheets

ROTARY LIFTING CAP

This nonprovisional application claims priority under 35 U.S.C. §119(a) on Patent Application No(s) 091221025 filed in TAIWAN on Dec. 24, 2002, which is(are) herein incorporated by reference.

FIELD OF THE INVENTION

The invention relates to a rotary lifting cap for electronic devices to selectively cover a portion of their electronic elements.

BACKGROUND OF THE INVENTION

With the continuous progress and developments in modern technology, electronic products are widely used in households and work places. They provide powerful functions and conveniences, and have greatly improved the quality of people's lives and enhanced people's productivity. In order to protect them from dust, provide protection and convenience of use, electronic devices generally have a rotary cap to cover a portion of their electronic elements. When in use, the cap may be turned and opened.

The most commonly used lifting cap has pivotal axles on two sides of one end to directly couple with the body of the electronic device. The lifting cap may be directly turned by the pivotal axles relative to the body of the electronic device to open the cap and expose a portion of the electronic elements for users to access and operate. The cap may be closed to avoid contamination when not in use.

While Such a design is simple, it has problems when in use, notably:
1. The pivotal axles and the body of the lifting cap are located on the same plane. The cap might get jammed when opened by force. This is especially troubling when used in emergency situations.
2. The lifting caps usually do not have a positioning function. When in use, the cap often drops and closes due to the force of gravity and severely affects user operations. While some caps have an anchoring function, their designs are not very convenient. They often do not have clear anchor points or the lift caps are difficult to maneuver. As a result, new problems occur.
3. The pivotal axles are located on one end of the cap. When opened, the cap is located on one side of the electronic element. If frequent use or heavy force operations are required, such as programmable controllers for CNC machinery, compression on the cap often occurs, which could result in the pivotal axle being broken.

SUMMARY OF THE INVENTION

In view of the foregoing problems, the primary object of the invention is to provide a rotary lifting cap with an arm that is easy to operate and an effective positioning design such that after the cap is turned and opened, user operation space is not affected. The invention not only improves convenience but can also increase the service life of the lifting cap.

The rotary lifting cap of the invention mainly includes a lid and two axle sections. The axle sections are located on two sides of the lid. Each axle section has an extension arm, a connection arm and a stub shaft. The extension arm has one end connected to one side of the lid that is extended rearwards in an arched manner. The connection arm has one end connected to another end of the extension arm and an anchor section, and another end for installing the stub shaft. The electronic device has a pivotal hole to couple with the stub shaft and enable the lid to be turned relative to the electronic device. The turning path has two anchor holes corresponding to the anchor section to allow the lid to be anchored at an open position and a closed position. The turning path between the two anchor holes protrudes inwards to form two sloped surfaces to allow the lid to be anchored at the two positions.

By means of the structure of the two-stage extension arm and connection arm, the stub shaft and the lid are not located on the same plane. Thus operation is easier. When turned, the lid is spaced from the electronic elements at a selected distance. Hence the lid may be protected without compression during operation. The design of the sloped surfaces aids the positioning function and makes anchoring more convenient.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENT

Figure 2:
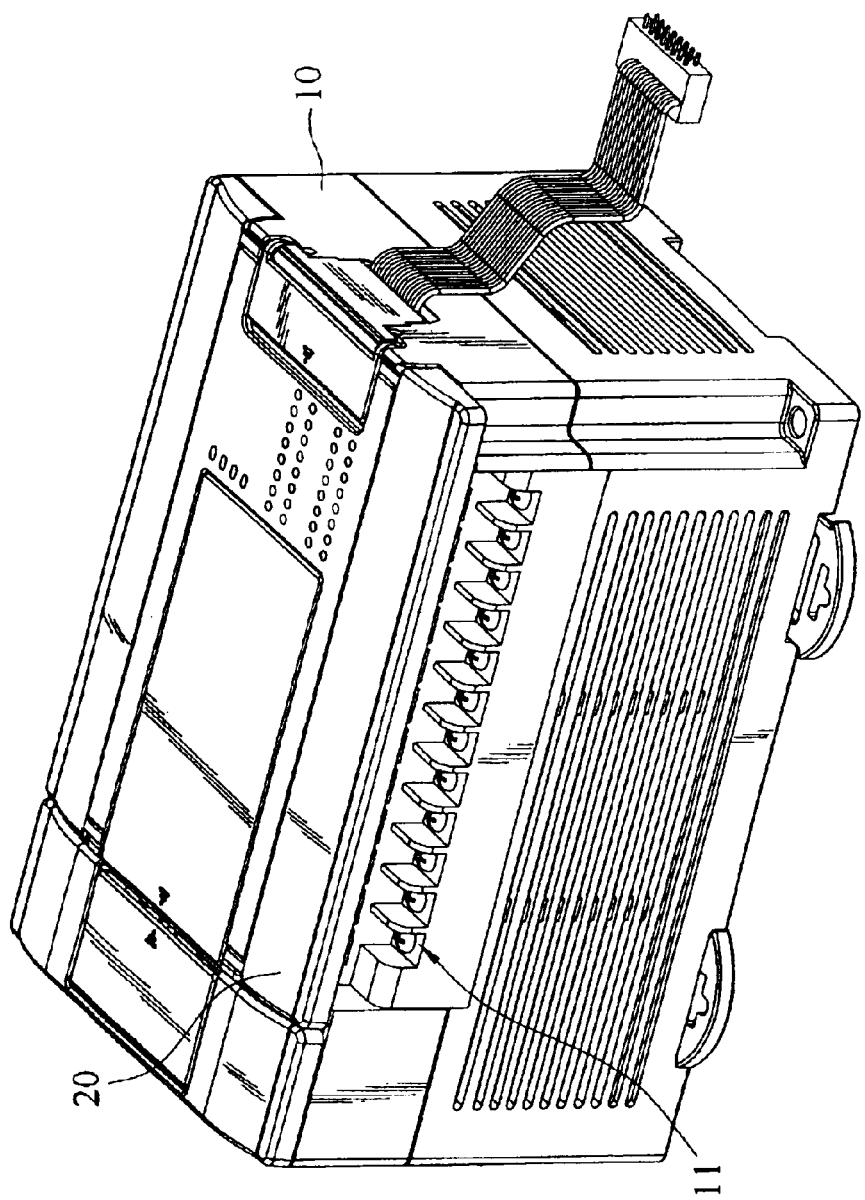
FIG. 2 is a schematic view of the rotary lifting cap of the invention in a closed position.
Figure 3:
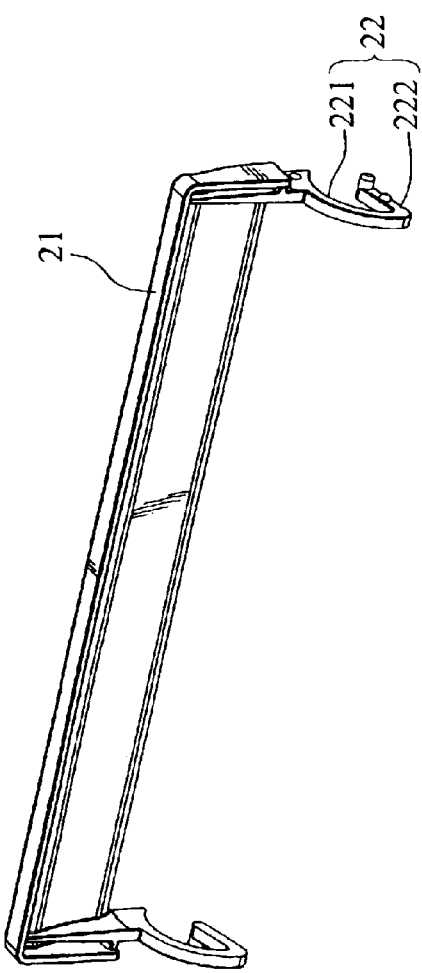
FIG. 3 is a perspective view of the rotary lifting cap of the invention.

Referring to FIG. 3, the rotary lifting cap 20 of the invention includes a lid 21 and two axle sections 22 located on two sides of the lid 21 for coupling with an electronic device 10. In normal conditions, the cap covers a portion of the electronic elements 11 (shown in FIG. 1). When in use, it may be turned relative to the electronic device 10 to expose the electronic elements 11 and enable users to operate (shown in FIG. 2).

Figure 4:
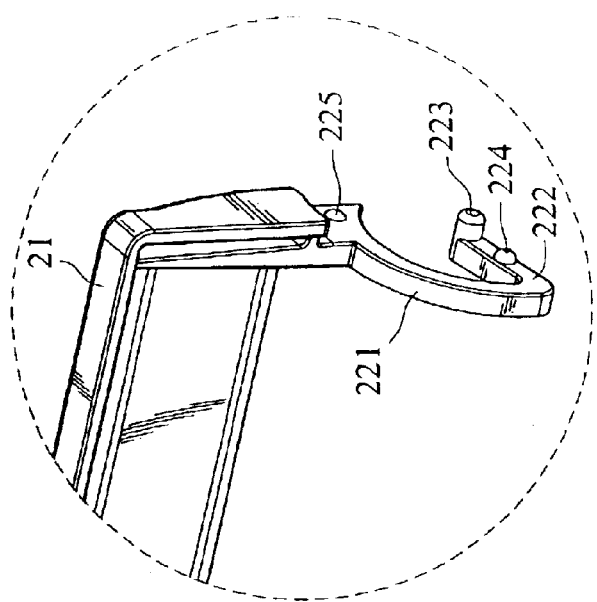
FIG. 4 is an enlarged perspective view of the axle section of the invention.
Figure 5:
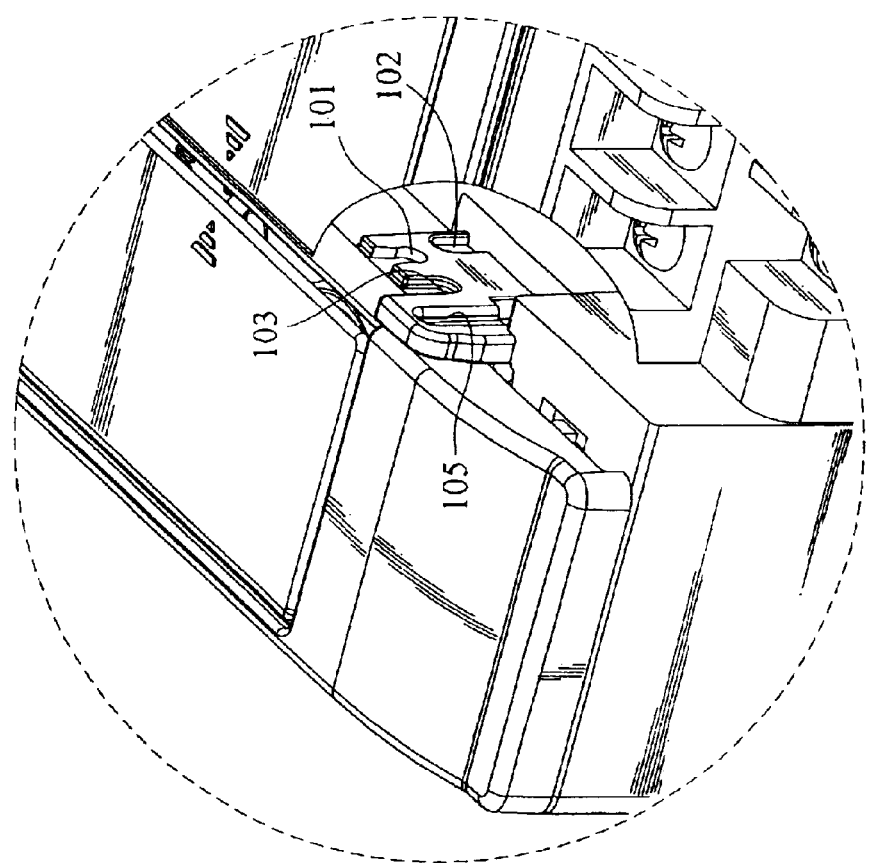
FIG. 5 is a schematic view of the anchor holes of the invention.

Referring to FIG. 4, each axle section 22 has an extension arm 221 and a connection arm 222 connected to the extension arm. (The extension arm 221 is formed in an arched shape proximate to the shape of a quarter of a circle. The lid 21 has one end extending downwards and rearwards. The connection arm 222 connects to the rear end of the extension arm 221 and is extended upwards slightly in a vertical manner. A pivotal stub shaft 223 is located on the rear end of the connection arm 222 and extends transversely. The electronic device 10 has a mating portion as shown in FIG. 5. It includes a pivotal hole 101 to engage with the stub shaft 223 so that the cap may be turned relative to the electronic device 10 at an open position (shown in FIG. 1) or a closed position (shown in FIG. 2).

Figure 6:
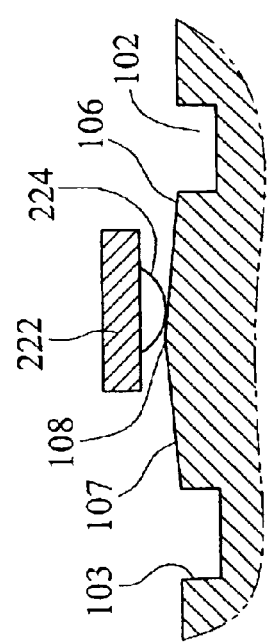
FIG. 6 is a schematic view of the turning path of the invention.

In addition, the connection arm 222 of the axle section 22 has an anchor section 224 (shown by a bulged spot in the drawings). The electronic device 10 has two anchor holes 102 and 103 located on the turning path to match the anchor section at the open and the closed position. The turning path between the two anchor holes 102 and 103 protrudes inwards as shown in FIG. 6 to form two sloped surfaces 106 and 107. The protruding portion forms a pinnacle 108 in the middle. Hence when the lid 21 is turned, the sloped surfaces 106 and 107 guide the lid to slide easily to the two anchor holes 102 and 103 for positioning. Meanwhile, the axle section 22 has a latch spot 225 corresponding to a latch slot 105 formed on the electronic device 10 to aid anchoring at the closed position (referring to FIGS. 4 and 5).

Figure 1:
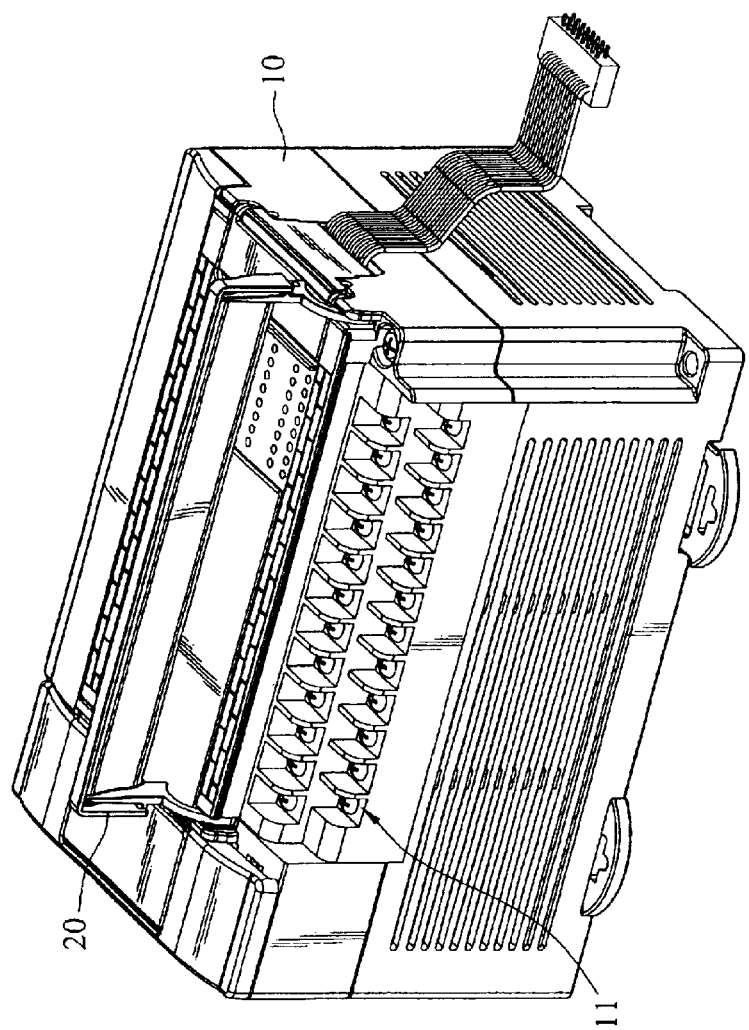
FIG. 1 is a schematic view of the rotary lifting cap of the invention in an open position.
Figure 7:
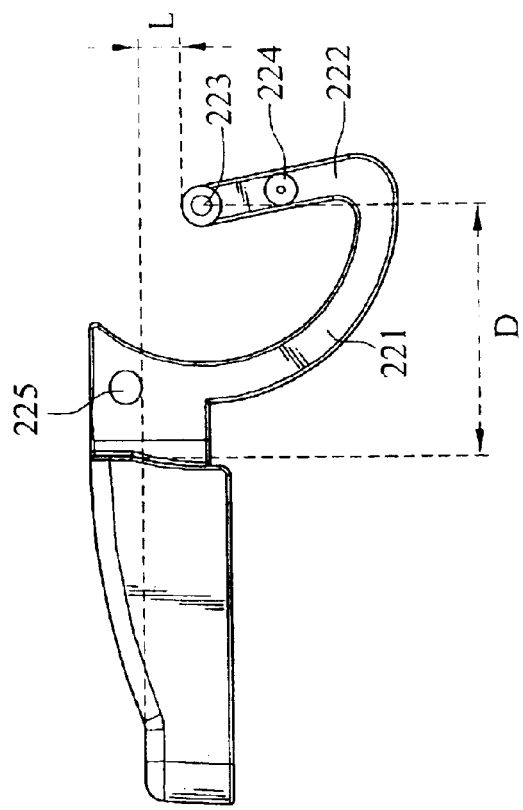
FIG. 7 is a schematic view of the invention, showing the arm and distances.

Referring to FIG. 7, the stub shaft 223 and the lid 21 are spaced to form an arm L. Thus jamming may be prevented when a force is applied parallel to the lid 21. Moreover, the stub shaft 223 is spaced from the lid 21 in another direction at a selected distance D. When the lid is turned and lifted, it does not fall over the electronic elements 11 (as shown in FIG. 1). Thus user operation is not affected and damage of the electronic elements may be avoided.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A rotary lifting cap for coupling on an electronic device to turn relative to the electronic device to generate open or closed operations to provide use or covering functions, comprising:

a lid; and two axle sections located on two sides of the lid, each axle section including:

an extension arm having one end connecting to one side of the lid and being extended rearwards in an arched manner;

a connection arm having one end connecting to another end of the extension arm and an anchor section; and a stub shaft connecting to another end of the connection arm and being extended outwards from two sides of the lid;

wherein the electronic device has a pivotal hole to engage with the stub shaft to allow the lid to turn relative to the electronic device along a turning path, the turning path having two anchor holes corresponding to the anchor section to allow the lid be anchored on an open position and a closed position, the turning path between the two anchor holes being protrusive inwards to form two sloped surfaces to aid the lid to be anchored on the two positions, and wherein the turning path of the electronic device corresponding to the anchor section has a protrusive pinnacle located in the middle portion between the open position and the closed position, the sloped surfaces being extended slowly towards two sides from the pinnacle.

2. The rotary lifting cap of claim 1, wherein the extension arm is formed in an arched shape proximate the size of a quarter of a circle, the lid having one end extending downwards and rearwards.

3. The rotary lifting cap of claim 2, wherein the connection arm is extended upwards proximately vertically from a distal end of the extension arm.

4. The rotary lifting cap of claim 1, wherein the stub shaft and the lid are not located on a same plane.

5. The rotary lifting cap of claim 1, wherein the anchor section is a bulged spot.

6. The rotary lifting cap of claim 1, wherein the axle section has a latch spot to latch the lid at the closed position.

7. The rotary lifting cap of claim 6, wherein the electronic device has a latch slot mating the latch spot.

* * * * *